United States Patent [19]
Lee et al.

[11] Patent Number: 5,767,732
[45] Date of Patent: Jun. 16, 1998

[54] CIRCUIT FOR PERMANENTLY ADJUSTING A CIRCUIT ELEMENT VALUE IN A SEMICONDUCTOR INTEGRATED CIRCUIT USING FUSE ELEMENTS

[75] Inventors: Jeong-In Lee, Kyounggi-do; Yang-Gyun Kim, Seoul, both of Rep. of Korea

[73] Assignee: Samsung Electronics Co., Ltd., Suwon, Rep. of Korea

[21] Appl. No.: 671,146

[22] Filed: Jun. 24, 1996

[30] Foreign Application Priority Data

Jun. 26, 1995 [KR] Rep. of Korea ............... 1995-17542

[51] Int. Cl.$^6$ .................. H01H 85/00; H03K 19/003
[52] U.S. Cl. .................................................. 327/525
[58] Field of Search ......................... 327/525; 326/16; 365/96

[56] References Cited

U.S. PATENT DOCUMENTS

| | | | |
|---|---|---|---|
| 4,814,640 | 3/1989 | Miyake | 327/525 |
| 4,935,645 | 6/1990 | Lee | 327/88 |
| 4,937,465 | 6/1990 | Johnson et al. | 327/525 |
| 5,404,049 | 4/1995 | Canada et al. | 327/525 |
| 5,448,199 | 9/1995 | Park | 327/525 |
| 5,450,030 | 9/1995 | Shin et al. | 327/525 |
| 5,469,077 | 11/1995 | Cox | 327/525 |
| 5,517,455 | 5/1996 | McClure et al. | 327/525 |

*Primary Examiner*—Toan Tran
*Assistant Examiner*—Terry L. Englund
*Attorney, Agent, or Firm*—Marger, Johnson, McCollom & Stolowitz, P.C.

[57] ABSTRACT

In a semiconductor integrated circuit, an internal passive circuit element value, such as a resistance, is permanently configured to a desired value by selectively fusing one or more fusing elements in response to corresponding input signals. An internal monitor circuit determines whether or not all of the requested fusing operations were successfully completed and, if so, permanently inhibits any further fusing operations. The circuit has the advantage of obviating external measurement of the adjusted circuit element value and further obviates the need for application of a lock input signal to inhibit further fusing operations. Accordingly, testing is simplified and the number of external pins is reduced.

20 Claims, 2 Drawing Sheets

CIRCUIT FOR PERMANENTLY ADJUSTING A CIRCUIT ELEMENT VALUE IN A SEMICONDUCTOR INTEGRATED CIRCUIT USING FUSE ELEMENTS

This application claims priority from Korean application number 95-17542, filed Jun. 26, 1995 and incorporated herein by this reference.

BACKGROUND OF THE INVENTION

1. Field of the Invention

The present invention relates to methods and apparatus for adjusting a circuit element value, such as a resistance value of a passive element in a semiconductor integrated circuit. More specifically this invention pertains to adjusting a resistance value in response to a series of input signals, by utilizing a series of fuse elements so that the resulting selected resistance value is permanent.

2. Description of the Prior Art

It is frequently necessary to adjust the value of one or more internal components in an integrated circuit, such as a resistor, to a selected value indicated by a series of input signals. This selection can be effected by using a series of fuse elements (Zn) as further explained below.

FIG. 1 is a schematic diagram of a portion of a semiconductor integrated circuit that includes a series of resistors, R1 through Rn, connected in series between external terminals X and Y. Initially, the total resistance between terminals X and Y is expressed by the $\Sigma$ of R1+R2 . . . +Rn. However, the resistance can be lowered by selectively shunting one or more of the internal resistors through a corresponding switch or shunting element S11, S12 . . . S1n. Each of the shunt elements is controlled by a corresponding fuse circuit which can take one of two states. In a first state, a fuse element within the fuse circuit is conductive and the fuse circuit sets the corresponding switch, for example S11, to an open state so that the resistor R1 remains in the path between terminals X and Y. In a second state, the fuse element has been blown open to a non-conductive state, and the fuse circuit sets the switch S11 to an ON or conducting state so that it provides a shunt path around the corresponding resistor R1. This has the effect of reducing the resistance between the X and Y terminals by the resistance R1. Once the fuse element has been blown to the non-conductive state, it cannot be restored, so the resistance change is permanent.

In FIG. 1, the series resistors R1 through Rn and the respective shunt switches S11 through S1n are surrounded by dashed box 30. The fuse circuits are enclosed in dashed box 20. The first switch S11 is controlled by the first fuse circuit 40. The fuse circuits are further subject to control of a lock circuit 10. The lock circuit prevents all of the fuse circuits from blowing open any fuse elements after an external LOCK signal has been asserted. If the LOCK signal has not been asserted, as further explained later, each of the fuse circuits operates in response to a corresponding input signal (A1 . . . An) and a common enable signal EN so as to blow open the corresponding fuse element when the enable logic signal is asserted and the corresponding input signal is asserted.

One of the limitations of the prior art circuit of FIG. 1 is its inability to verify whether or not fuse elements have been successfully blown open in response to the input signals. Another limitation of the prior art circuit is that spurious noise on the input signals can cause unintended blowing open of additional fuse elements unless the LOCK signal has been successfully asserted. However, the LOCK signal must be provided externally, for example in response to conducting a measurement of the resistance value between external terminals X and Y. This requires not only external test equipment, but further requires that external pins X and Y be provided in the integrated circuit packaging.

Accordingly, one of the objects of the present invention is to provide for verification internally, i.e., within the integrated circuit, that the appropriate fuse elements have been successfully blown open in response to the input signals. Another object of the invention is to prevent unintended operation of fuse circuits by inhibiting the fuse circuits after verification that the intended fusing steps were successfully completed. Internal verification of these steps obviates the requirement for external measurement at the X and Y terminals of the resistance value therebetween.

Another object of the present invention is to provide an internal mechanism for inhibiting the fuse circuits from blowing up additional fuses, without the need for an externally provided lock signal. Such a feature would simplify external test equipment requirements and reduce the IC package pin count.

SUMMARY OF THE INVENTION

One aspect of the present invention is a method of preventing noise from triggering unintended fusing in a semiconductor integrated circuit of the type that includes a plurality of fuse elements for adjusting an impedance between two nodes X and Y. The new method includes providing a respective fuse control circuit for controllably fusing selected fuse elements in response to corresponding control input signals. Each fuse control circuit generates an output signal that indicates whether fusing has been completed. The present method calls for monitoring all of the fuse control circuit output signals so as to determine whether fusing has been completed in all of the fuse control circuits as required by the input signals. When all of the fusing has been completed in all of the fuse control circuits, a monitor output logic signal (MONB) is asserted. That MONB signal is used to inhibit any further fusing of fuse elements in the semiconductor integrated circuit, so the old external LOCK signal is unnecessary.

Another aspect of the present invention includes a circuit for adjusting a circuit element value to a specified value in a semiconductor integrated circuit of the type in which the circuit element value is adjusted by employing a plurality of fuse elements that permanently fuse open when a fuse current flows through them. The new circuit receives a plurality of input signals (An) that correspond to a desired circuit element value. A plurality of fuse control circuits are provided, each fuse control circuit including a fuse element and means for fusing the fuse element to a non-conducting state in response to a corresponding fuse control input signal derived from a corresponding one of the input signals. Each fuse control circuit further provides a corresponding switch control signal (B1-Bn) and a monitor signal (M1-Mn) that indicates whether or not the corresponding fuse element has been fused. The circuit includes means for adjusting the circuit element value between X and Y terminals in response to these switch control signals; and includes monitoring means (400) for monitoring the monitor signals (Mn) and for providing a monitor output logic signal (MONB) that indicates whether or not all of the fuse elements indicated by the input signals (An) have been fused.

In a presently preferred embodiment, each of the fuse control circuits includes a first switching control logic means for asserting the fuse control input signal so as to fuse the corresponding fuse element only when the corresponding input signal is asserted (An=0) and the monitor output logic signal (MONB) is not asserted (MONB=1). Additionally, each of the fusing circuits includes output means coupled to the fuse element so as to provide a fuse logic signal that indicates whether the corresponding fuse element is fused (open) or not fused (conductive).

The foregoing and other objects, features and advantages of the invention will become more readily apparent from the following detailed description of a preferred embodiment which proceeds with reference to the drawings.

DETAILED DESCRIPTION OF THE PREFERRED EMBODIMENT

Figure 1:
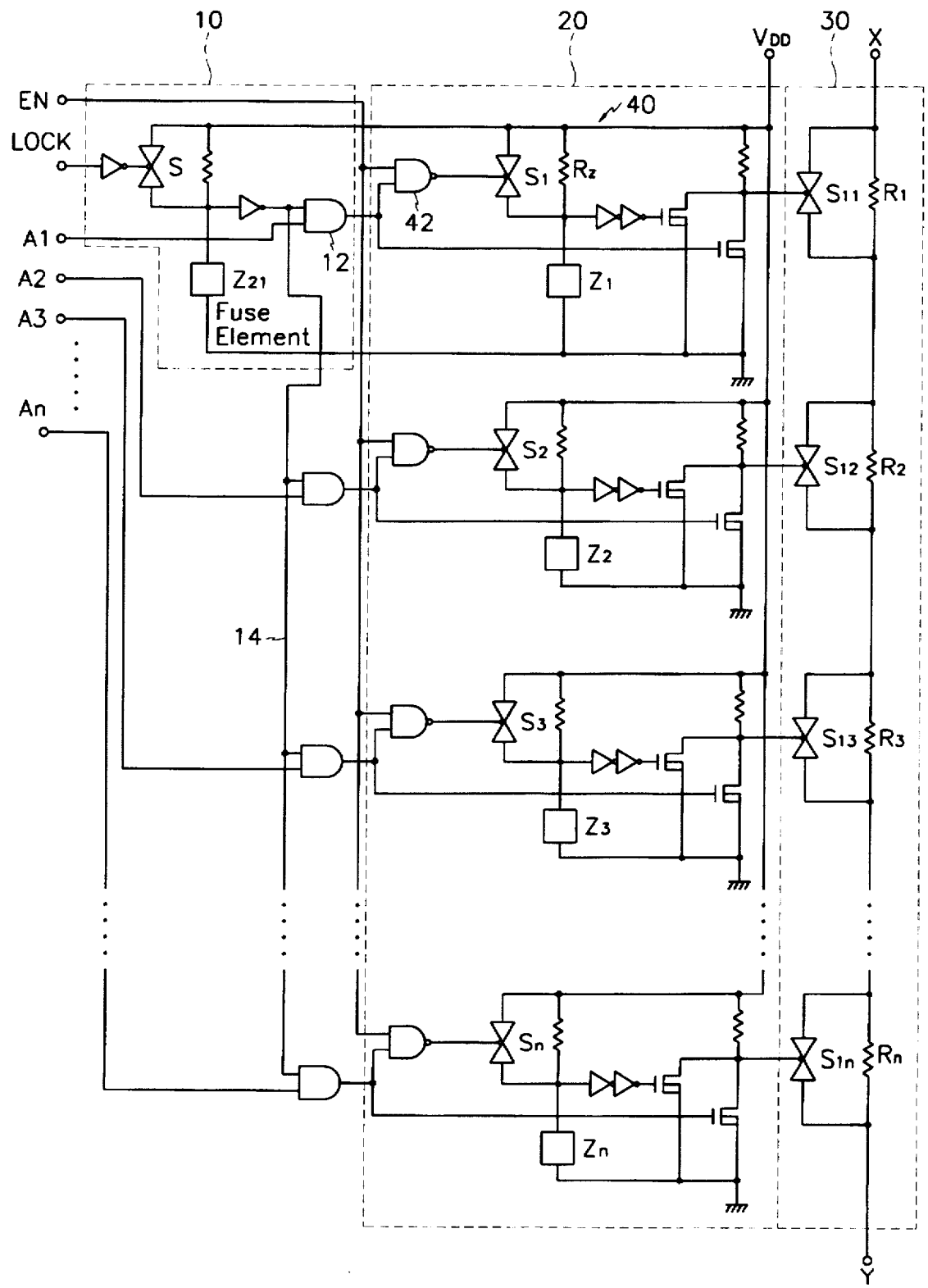
FIG. 1 is a schematic diagram illustrating a prior art circuit for adjusting a circuit element value in a semiconductor integrated circuit.

FIG. 1 shows a prior art circuit for adjusting a circuit element value in an integrated circuit. In FIG. 1, a plurality of resistors R1 through Rn are connected in series between external terminals X and Y. Each of the resistors has a switch element connected in parallel with it, for example switch S11 is disposed in parallel with resistor R1. The switch element comprises, for example, a transmission gate so that when one of the switches is turned ON, the corresponding resistor is shunted with the result that the corresponding resistor effectively has zero resistance. Thus, the total resistance between the X and Y terminals can be precisely adjusted by selectively shunting one or more of the resistors in the series. The series-connected resistors and the switch elements S11 through S1n are collectively referred to as the impedance adjustment circuit 30.

The switches in the impedance adjustment circuit 30 are controlled by a like number of fuse control circuits, together indicated by dashed line 20. Each of the fuse control circuits is controlled by the corresponding input logic signal A1 through An, as further described later. A locking circuit 10 includes a lock fuse Z21. The lock circuit 10 fuses the lock fuse element in response to assertion of the LOCK input signal. Once the lock fuse element has been fused to the nonconductive state, logic gate 12 prevents the input signal (here A1) from triggering fusing in the corresponding fuse control circuit (40). The lock signal 14 is coupled to corresponding gates for each of the remaining input signals so that none of the input signals can be effectively asserted when the lock signal is asserted. Since the lock signal is derived from the state of the lock fuse Z21, it is permanently asserted once the lock fuse Z21 has been fused. Thus, all of the fuse control circuits are inhibited from fusing additional fuse elements once the externally applied lock signal has been asserted. The input signals are further qualified by a common enable signal as shown in the schematic diagram. The primary drawback of the prior art is that external testing must be done to assure that the selected fuses are properly fused. Toward that end, the nodes X and Y must be brought out to external pins for measuring the adjusted impedance. And, the external signal LOCK must be provided to the IC to inhibit further fusing.

Operation of the individual fuse control circuits is described by way of example with reference to the first fuse control circuit 40. If the corresponding input signal A1 is asserted high, and the lock signal 14 is high, the output of AND gate 12 is high. That signal is gated with the enable signal and NAND gate 42 to control switch S1. As long as switch S1 is off, the fuse element Z1 in its conductive state pulls down on the resistor Rz. When an inactive state is asserted by inputting a low logic value to a fusing enable signal EN and a signal LOCK for controlling the input, and a high or low logic value is a plurality of input signals A1-An provide fusing data that indicate a desired value of resistance between X terminal and Y terminal. The switches S11-S1n assume a short or open state according to the input signals. The total resistance will be the sum of the resistors where the corresponding switches are open. Shorted or closed switches shunt the corresponding resistors so they do not contribute to the total resistance between X and Y terminals. To perform fusing, a high logic value is input to the fusing enable signal EN and the fusing data is input to the input signals A1-An. For example, when the input signal Ai is low, fusing of the corresponding fuse element Zi is not performed because switch S1i turns off and, when the input signal Ai is high, fusing of the fuse element Zi is performed because the switch S1i turns on, subject to the additional control logic described later. To ascertain whether fusing is completed, a test is conducted through an external circuit (not shown) connected to the X and Y terminals.

If the external test determines that the resistance value specified at the input signals is not present at X–Y, it implies that at least one of the specified fuse elements is not fused, so a fusing operation is repeated. When fusing is completed and the circuit for adjusting a circuit element value exhibits the desired impedance, a high logic value is applied at the LOCK input, and the switch S turns on, fusing of the fuse element Z21 is performed. Once the lock fuse Z21 is opened, lock signal 14 goes low, preventing further fusing in all of the fuse circuits 20. The prior art arrangement thus requires an external test in order to ascertain whether fusing is completed, and necessarily requires the input control signal LOCK in order to prevent further fusing of the fusing circuit due to noise after it is verified that fusing is completed.

Figure 2:
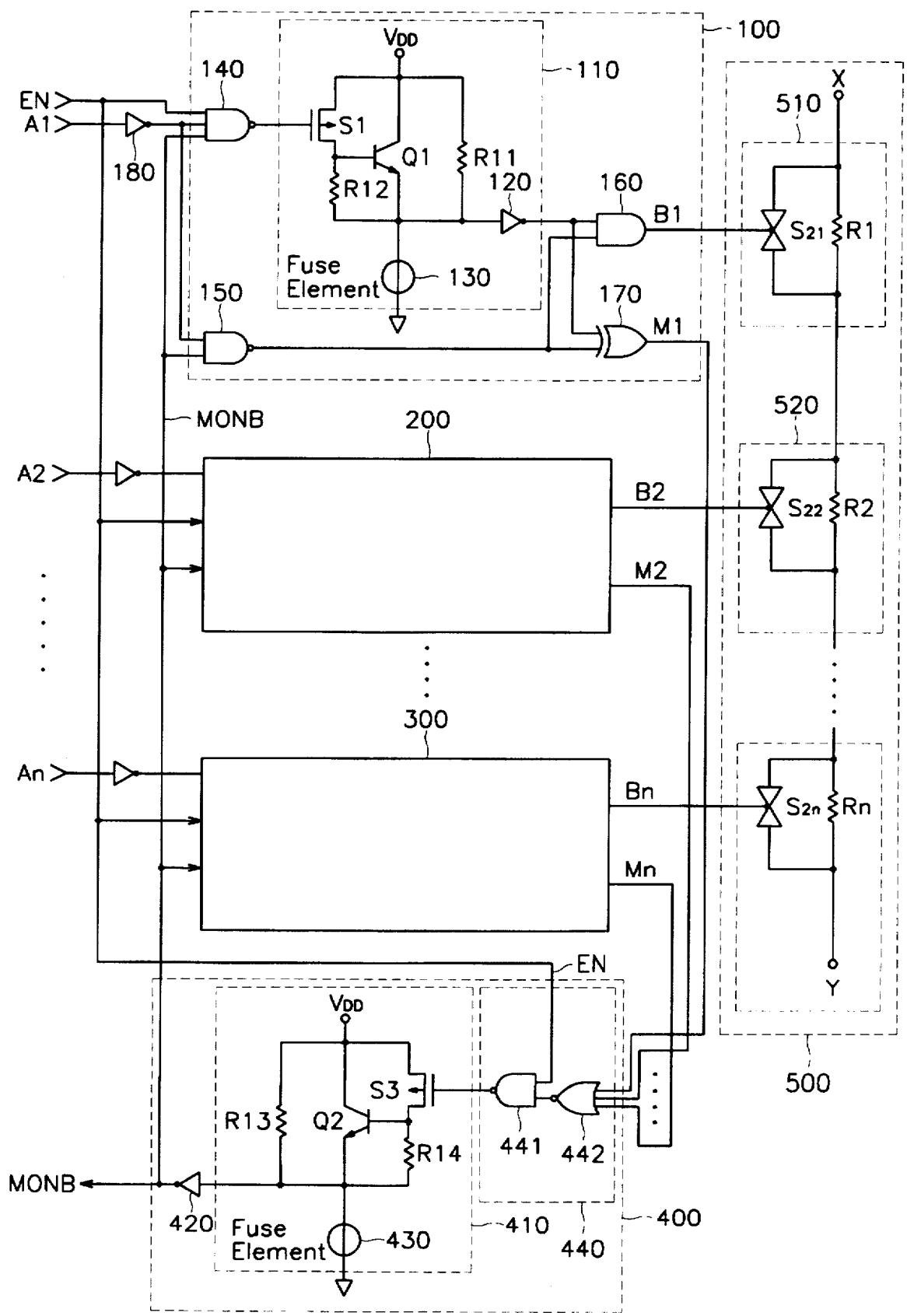
FIG. 2 is a schematic diagram of an improved circuit for adjusting a circuit element value in a semiconductor integrated circuit according to the present invention.

FIG. 2 shows a circuit for adjusting a circuit element value of a semiconductor IC according to the present invention. The circuit comprises the fusing enable signal EN; a plurality of input signals A1-An for inputting fusing signals; a plurality of fuse control circuits 100, 200, 300 each of which performs fusing according to the applied fusing signals as further explained below. A monitoring circuit 400 provides a monitor output signal MONB which gates the input signals so as to ensure that fusing is not performed when fusing is completed and shows whether fusing is completed or not. An impedance adjustment circuit 500 comprises a plurality of resistors R1-Rn which are passive elements, and a plurality of switching devices S21-S2n each connected in parallel to a respective one of the resistors for selectively shunting the corresponding resistor responsive to the input signals Ai in order to form the desired impedance between nodes X and Y. Note that nodes X and Y no longer need be brought out to external pins, as the necessary testing in conducted internally. The fuse control circuits 100, 200, 300 operate as explained next with reference to the first circuit.

A first fuse control circuit 100 comprises a fusing circuit 110 having a fuse element 130. A first NAND gate 140 which is a first switching control device provides a fuse control input signal to switch S1. A second NAND gate 150; a first AND gate 160 which outputs a switch control signal B1 for controlling the switching device S21 of the impedance control circuit 500. A first exclusive-OR gate 170 provides a monitor signal M1 showing whether fusing is completed or not. And the fusing circuit 110 includes a first switching device S1 which turns on or off according to the logic value of the fuse control input signal. A bipolar transistor Q1 is arranged to provide a fusing current through the fuse element 130 when S1 is ON. Resistor R12 keeps Q1 OFF when S1 is off. A pull-up resistance R11 for pulling up the supply voltage when fusing of the fuse element is performed; and a second invertor 120 outputs a fuse logic signal that exhibits a logic low value when fusing of the fuse element is performed and outputs a high logic value when fusing of the fuse element is not performed.

In the fuse control circuit 100, a first input of the first NAND gate 140 is coupled to the fusing enable input signal EN, and a second input is connected to the output of a first invertor 180 which inverts the corresponding input signal A1, and a third input is coupled to the monitor output signal MONB which is the output from the monitoring 400. Thus, gate 140 asserts the fuse control input signal so as to fuse the corresponding fuse element only when the corresponding input signal is asserted (An=0) and the monitor output logic signal (MONB) is not asserted (MONB=1).

A first input of the second NAND gate 150 is coupled to the output of the first invertor 180 and a second input is connected to the monitor output signal MONB. The output of the second NAND gate 150 is connected with a first input of a first AND gate 160 and a first input of a first exclusive-OR gate 170. The other input of a first AND gate 160 receives the fuse logic signal from invertor 120, so that the gate 160 output provides the switch control signal B1. The second input of XOR 170 also receives the fuse logic signal from invertor 120, so that the gate 170 output provides the monitor signal M1 indicating whether or not the fusing indicated by the input signals is done.

The monitoring circuit 400 comprises a fusing block 410 which is similar to the structure of the fusing circuit 110; a third invertor 420; a monitor fuse element 430 and a switching control device 440 for turning on or off the third switching device S3 of the fusing block 410. The switching control device 440 has a third NAND gate 441 and a first NOR gate 442 and one input of the third NAND gate 441 is connected with the fusing enable signal EN and the other input of the third NAND gate 441 is connected with the input of the first NOR gate 442. The input of the first NOR gate 442 is connected with the respective monitor signals M1-Mn which are the output from the fuse control circuits 100, 200, 300. A preferred embodiment in accordance with the present invention has the input signals A1-An of N units, so a plurality of the fusing circuits of N units are also required.

As defined in the preferred embodiment in accordance with the present invention, a first switching device S1 of the fusing circuit 110 and a third switching device S3 of the fusing block 410 can be implemented as CMOS transmission gates or as bipolar transistors. The adjusting circuit 500 can employ a series of resistors, as illustrated, or other passive elements such as capacitors to allow selection of a capacitance value between X and Y nodes.

OPERATION

A plurality of the fuse control circuits have the same structure, so the operation of only a first fuse control circuit will be described. In order to adjust the circuit element value to a desired value by combining the passive elements R1-Rn formed between X terminal and Y terminal, first of all, a low logic signal is provided as the fusing enable input signal EN.

A low input causes NAND gate 140 to go high at the gate of S1, turning OFF the first switch S1 of the fusing circuit 110. Since S1 is OFF, no base current is supplied to Q1, and R12 pulls down the base terminal, so Q1 is OFF as well. No fusing current is applied to the fuse element 130, so the fuse pulls down the fuse node at R11, causing the output of invertor 120 to go high—the fuse logic signal. This fuse logic signal is input to gate 160 further explained below. The fuse logic signal high indicates that the fuse is conductive— i.e. it has not been fused.

Turning for now to the monitor circuit 400 in FIG. 2, the fusing enable signal EN having a low logic value is input to a NAND gate 441, causing its output to go high. A switching control circuit 440 thus has a logic high output signal applied to the gate of S3. Accordingly, S3 is OFF, and thus Q2 is off for the reasons explained above. The fuse element 430 remains conductive, again pulling down the fuse node at R13, and causing the output of invertor 420 to go high—the monitor output signal MONB. This logic signal MONB is input to all of the fuse circuits, e.g. 110,200 where is qualifies the corresponding select input signal A1, A2, etc. as noted previously. Since MONB is high, fusing will be permitted.

The switch control signals B1-Bn which control switches S21-S2n, respectively, in the impedance adjustment circuit 500 in general track the corresponding input data applied at A1-An. For example, when the input signal A1 is high, it causes a first switch control signal B1 to go high, and the corresponding switching device S21 of the impedance adjustment circuit 500 turns off, so the impedance value of a first impedance circuit 510 becomes R1. Conversely, when a low logic value is input to the input signal A1, it causes switching device S21 to turn on, and the impedance value of the first impedance circuit 510 becomes zero, as R1 is shunted by S21. By differentiating the input data of the input signals A2-An in the above mentioned method, a desired impedance value between X terminal and Y terminal is effected.

To configure the part, a logic high value is input to the fusing enable signal EN and selected input data is applied to the input signals A1-An. If input signal A1 of a first fuse control circuit 100 has a high logic value, fusing of the fuse element 130 is not performed because the output of a first NAND gate 140 becomes high and a first switching device of the fusing circuit 110 turns off. Since /A1 is low, gate 150 is high. Accordingly the output of AND gate 160 which is a second switching control device becomes high and the switching device S21 of a first impedance circuit 510 in the impedance control circuit 500 turns off, the impedance value of the first impedance circuit 510 becomes R1. Since 150 is high and 120 is high, M1 is low—the monitor signal. This indicates that fusing is completed, or was not enabled or not requested.

Alternatively, if A1 is low logic value, a first switching device S1 turns on because the output of a first switching control device 140 becomes low. If it is supposed that the current flowing through the resistor R12 is I, the current transmitted from the supply voltage Vdd to the bipolar transistor Q1 is the amplified current of $\beta I$ when it is supposed that the beta factor of the bipolar transistor Q1 is $\beta$. Therefore fusing of the fuse element 130 is performed because the high current of $I+\beta I$ flows through the fuse element 130, and the output of a first invertor 120 becomes low by the pull-up resistance R11 of the fusing circuit 110, and a first control signal B1 which is the output of a first AND gate 160 being a second switching control device becomes low. Because switching device S21 of a first impedance circuit 510 in the impedance adjustment circuit 500 turns on. the impedance value of a first impedance circuit 510 becomes zero. The fusing signal M1 of a first fuse control circuit 100 outputs a low logic value, here indicating that fusing is completed successfully. The same operation applies to each of the other fuse circuits 200–300 corresponding to input signals A2-An as noted. Thus the total resistance between nodes X and Y is equal to Σ(Ai*Ri) over i=1 to n, where A is zero or one.

The monitor output signal MONB also provides an output signal that indicates successful configuration of the part in accordance with the input signals. In other words, it confirms that all fusing has been done, and it inhibits any further fusing to avoid unintended fusing due to noise. All of the individual monitor signals M1-Mn are input to a common NOR gate 442 so that when all of the M signals are low—indicating fusing done if required—gate 442 goes high. If enable EN is high, gate 441 goes low and a third switching device S3 of the fusing block 410 turns on, and fusing of the fuse element 430 is performed. The fuse 430 node goes high, and MONB goes low. The monitor output signal MONB is input to the respective first NAND gate (e.g. 140) in each fuse control circuit so all of the first NAND gates are forced high. This keeps all of the fusing switches S1-Sn off to prevent further fusing.

However if an attempt to perform fusing of the fuse element of the fusing block is practiced but fusing is not performed, so to speak, if abnormal fusing is performed due to noise in the input signal or the time of fusing is not sufficiently long, for example, if the low logic value is input to the input signal A1 in order to perform fusing of the fuse element 130 of a first fuse control circuit 100 but fusing is not completed, a first fusing signal M1 being output of the exclusive-OR gate 170 outputs a high logic value because the output of a first invertor 120 has a high logic value. And fusing of the fuse element 430 in the fusing block 410 is not performed and the monitor output signal MONB outputs the same high logic value as the previous state because the output of a third switching controlling device in the circuit for controlling input signal has a high logic value. Therefore, the users can know that fusing is not completed by the monitor output signal MONB which has a high logic value and they perform fusing again to complete the fusing. As mentioned above, because the circuit for adjusting circuit element value of a semiconductor IC in the present invention recognizes whether fusing is normally performed or not internally and qualifies the input signals in order that further fusing is not performed if fusing was completed, the other input control signal (LOCK) is not required and the prior art external testing is not required to ascertain whether fusing has been completed.

Having illustrated and described the principles of my invention in a preferred embodiment thereof, it should be readily apparent to those skilled in the art that the invention can be modified in arrangement and detail without departing from such principles. I claim all modifications coming within the spirit and scope of the accompanying claims.

What is claimed is:

1. A circuit for adjusting a circuit element value in a semiconductor integrated circuit to a specified value as determined between X and Y terminals in which the circuit element value is adjusted by employing a plurality of fuse elements that permanently fuse open when a predetermined fuse current flows through them, comprising:

input means for receiving a plurality of input signals (An) that indicate the specified value;

a plurality of fuse control circuits, and each fuse control circuit including a corresponding fuse element from the plurality of fuse elements, and means for fusing the corresponding fuse element to a non-conducting state responsive to a fuse control input signal derived from a corresponding one of the input signals; and each fuse control circuit providing a corresponding switch control signal and a corresponding monitor signal that indicates whether or not the corresponding fuse element has been fused;

means for adjusting the circuit element value between the X and Y terminals in response to the switch control signals; and monitor means for monitoring the monitor signals and for providing a monitor output logic signal that indicates whether or not all of the fuse elements indicated by the input signals have been fused.

2. A circuit according to claim 1 wherein:

each of the fuse control circuits (100) includes a first switching control logic means (140) for asserting the fuse control input signal so as to fuse the corresponding fuse element only when the corresponding input signal is asserted (An=0) and the monitor output logic signal (MONB) is not asserted (MONB=1); and each of the fusing means (110) includes output means coupled to the corresponding fuse element for providing a corresponding fuse logic signal (120) responsive to the state of the corresponding fuse element as being fused or not fused.

3. A circuit according to claim 2 wherein the first switching control logic means comprises a first NAND gate (140) and said circuit further comprises enable input means for receiving an enable input logic signal (EN) coupled to all of the fuse control circuits for enabling said selective fusing of the fuse elements;

and wherein the first NAND gates in each of the fuse control circuits receives the enable input logic signal at a first input, the corresponding input signal (An) at a second input, and the monitor output logic signal (MONB) at a third input so as to form the fuse control input signal at the output of the first NAND gate.

4. A circuit according to claim 2 wherein each fusing element is initially a conductive element and fuses to an open circuit when the fuse current is passed through the fuse element.

5. A circuit according to claim 2 wherein each of the fuse control circuits further comprises:

logic means (150) for combining the corresponding input signal (An) and the monitor output logic signal (MONB); and a second switching control logic means (160) for combining the output of the said logic means (150) together with the fuse logic signal (120) so as to assert the switch control signal (Bn) only when the fuse logic signal is consistent with the state of the corresponding input signal (An) and the monitor output logic signal (MONB) is not asserted.

6. A circuit according to claim 5 wherein each of the fuse control circuits further comprises XOR logic means (170) for combining the fuse logic signal (120) together with the output of the logic means (150) so as to assert the monitor output logic signal (Mn) when the corresponding fuse element is selected by the corresponding input signal (An) and is fused.

7. A circuit according to claim 5 wherein the second switching control logic means comprises a first AND gate (160), the AND gate having a first input coupled to receive the fuse logic signal and a second input coupled to receive the output of the logic means (150).

8. A circuit according to claim 2 wherein each of the fuse elements is connected between a respective fuse element node and ground, and each fusing means includes:

a switch (s1) for receiving the corresponding fuse control input signal;

a current amplifier (Q1) coupled in series between a voltage supply and the fuse element node and having a control terminal (base) coupled to the switch so as to provide the predetermined fuse current through the fuse element sufficient to fuse the fuse element to a non-conductive state responsive to turning ON the switch;

a pull-up device (R11) coupled to the fuse element node for pulling up a fuse element node voltage so as to provide a logic high signal when the fuse element is non-conducting; and an invertor (120) also coupled to the fuse element node so as to invert the logic high signal to provide a logic low signal as the fuse logic signal when the fuse element is non-conducting.

9. A circuit according to claim 8 wherein the switch comprises a voltage-controlled current source and the current amplifier comprises a bipolar transistor; the current source being coupled to the base terminal of the bipolar transistor.

10. A circuit for adjusting a passive element value in a semiconductor integrated circuit comprising:

a series-connected plurality of passive circuit elements (R1-Rn) disposed within the integrated circuit such that the passive element value is a total value of the passive elements which equals a sum of the individual passive circuit elements that are not shunted;

a corresponding switch means (S21-S2n) disposed in parallel to each of the passive circuit elements for controllably shunting the corresponding passive circuit element in response to a state of the corresponding switch means so that the shunted passive circuit element does not contribute to the total value of the passive elements;

a corresponding fuse control circuit (100) coupled to each of the switch means to control the state of the corresponding switch means and thereby selectively shunt or not shunt the corresponding passive circuit element, each fuse control circuit including a fuse element (130) and means for fusing the fuse element, thereby changing a state of the fuse element from a conducting state to a non-conducting state;

each fuse control circuit (100) further including a switch output signal (B1-Bn) for controlling the corresponding switch means (S21-S2n) responsive to the state of the fuse element, and a monitor output signal (M1-Mn);

a common enable signal (EN) input terminal, for receiving an enable logic signal, coupled to all of the fuse control circuits;

input means for receiving at least one input signal (A1-An) for indicating a desired state of each of the fuse elements; and monitor means (400) for monitoring the monitor output signals, for determining whether or not each of the fuse control circuits is in a state in compliance with the at least one input signal, and for inhibiting the fuse control circuits.

11. A circuit according to claim 10 wherein the passive circuit elements include resistors.

12. A circuit according to claim 10 wherein the monitor means includes a monitor fuse element (430), and means for fusing the monitor fuse element to a non-conducting state when all of the monitor output signals (Mn) are asserted, thereby permanently latching an indication that all fusing of the other fuse elements has been completed in accordance with the at least one input signal.

13. A circuit according to claim 12 wherein the means for fusing the monitor fuse element includes a logic gate (442) coupled to receive all of the monitor output signals (Mn) for detecting when all of the monitor output signals (Mn) are asserted.

14. A circuit according to claim 13 wherein the total value is adjusted to a specified value as determined between X and Y terminals, the circuit further includes a second input means for receiving the enable logic signal to enable selective fusing of said fuse elements, and the means for fusing the monitor fuse element further includes means responsive to the enable logic signal for preventing fusing of the monitor fuse element when the said enable logic signal is not asserted.

15. A circuit according to claim 14 wherein the enable logic signal is active high, and the monitor output signals are active low, and the means responsive to the enable logic signal for preventing said fusing of the monitor fuse element when the enable logic signal is not asserted comprises a logic NAND gate coupled to receive the enable logic signal at a first input and to receive an output of the logic gate at a second input.

16. A circuit according to claim 14 wherein each of the fusing means within each of said corresponding fuse control circuits includes a bipolar transistor coupled to the corresponding fuse element and a fuse control switch means coupled to receive a fuse control input signal in response to the at least one input signal, the fuse control switch means including an MOS transistor coupled to the base of the bipolar transistor.

17. A method of preventing noise from triggering unintended fusing in a semiconductor integrated circuit of the type that includes a plurality of fuse elements used in adjusting an impedance between two nodes X and Y, the method comprising the steps of:

providing a respective fuse control circuit for controllably fusing each one of said fuse elements of said plurality of fuse elements in response to corresponding control input signals;

in each fuse control circuit, generating an output signal that indicates whether the controlled fusing has been completed;

monitoring all of the fuse control circuit output signals so as to determine whether the controlled fusing has been completed in all of the fuse control circuits;

asserting a monitor output logic signal (MONB) when all of the controlled fusing has been completed in all of the fuse control circuits; and in response to the monitor output logic signal, inhibiting any further fusing of said plurality of fuse elements in the semiconductor integrated circuit.

18. A method according to claim 17 and further comprising providing the monitor output logic signal to an external terminal of the integrated circuit for use in testing and configuring the integrated circuit.

19. A method according to claim 17 and further comprising providing a monitor fuse in the semiconductor integrated circuit and fusing the monitor fuse when the selected fusing has been completed in all of the fuse control circuits; and asserting the monitor output logic signal in response to a state of the monitor fuse so that the monitor output logic signal cannot change state once it has been asserted.

20. A method according to claim 17 further comprising adjusting the impedance between said nodes only when an input signal indicates said adjustment and the monitor output logic signal is not asserted.

* * * * *